(12) United States Patent
Twitto

(10) Patent No.: US 11,914,470 B2
(45) Date of Patent: *Feb. 27, 2024

(54) EFFICIENT REDUNDANCY MANAGEMENT IN KEY-VALUE NAND FLASH STORAGE

(71) Applicant: Pliops Ltd., Tel Aviv (IL)

(72) Inventor: Moshe Twitto, Givat Shemuel (IL)

(73) Assignee: PLIOPS LTD., Tel Aviv (IL)

( * ) Notice: Subject to any disclaimer, the term of this patent is extended or adjusted under 35 U.S.C. 154(b) by 15 days.

This patent is subject to a terminal disclaimer.

(21) Appl. No.: 17/645,312

(22) Filed: Dec. 20, 2021

(65) Prior Publication Data

US 2022/0188188 A1 Jun. 16, 2022

Related U.S. Application Data

(63) Continuation of application No. 16/228,905, filed on Dec. 21, 2018, now Pat. No. 11,210,166.

(60) Provisional application No. 62/609,342, filed on Dec. 22, 2017.

(51) Int. Cl.
| | |
|---|---|
| *G06F 11/00* | (2006.01) |
| *G06F 11/07* | (2006.01) |
| *G06F 11/10* | (2006.01) |
| *G06F 12/02* | (2006.01) |
| *G11C 11/56* | (2006.01) |
| *G11C 16/16* | (2006.01) |
| *G11C 16/34* | (2006.01) |
| *G11C 29/52* | (2006.01) |

(52) U.S. Cl.
CPC ........ *G06F 11/1068* (2013.01); *G06F 11/076* (2013.01); *G06F 12/0246* (2013.01); *G11C 11/5628* (2013.01); *G11C 16/16* (2013.01); *G11C 16/349* (2013.01); *G11C 29/52* (2013.01)

(58) Field of Classification Search
None
See application file for complete search history.

(56) References Cited

U.S. PATENT DOCUMENTS

| | | | | |
|---|---|---|---|---|
| 5,559,956 | A * | 9/1996 | Sukegawa | ............ G11C 16/10 714/6.13 |
| 5,598,370 | A | 1/1997 | Niijima | |
| 6,377,500 | B1 * | 4/2002 | Fujimoto | ............ G06F 12/0246 365/230.01 |
| 6,684,289 | B1 * | 1/2004 | Gonzalez | ............ G06F 12/04 711/171 |
| 7,171,513 | B2 | 1/2007 | Gonzalez | |

(Continued)

*Primary Examiner* — Mujtaba M Chaudry
(74) *Attorney, Agent, or Firm* — Reches Patents

(57) ABSTRACT

A method for error correction of logical pages of an erase block of a solid state drive (SSD) memory, the method may include determining an erase block score of the erase block, wherein the calculating is based on a program erase (PE) cycle of the erase block and one or more erase block error correction parameter; determining, based on (a) the erase block score, and (b) a mapping between the erase block score and one or more page error correction parameters for each page type out of multiple pages types, the one or more page error correction parameter for each page type; and allocating, within each page of the erase block, an overprovisioning space and an error correction space, based on at least one page error correction parameter related to a page type of the page.

18 Claims, 10 Drawing Sheets

(56) References Cited

U.S. PATENT DOCUMENTS

| | | | | |
|---|---|---|---|---|
| 8,995,197 | B1* | 3/2015 | Steiner | G11C 29/028 |
| | | | | 365/185.19 |
| 10,739,996 | B1* | 8/2020 | Ebsen | G06F 16/1727 |
| 2009/0129163 | A1 | 5/2009 | Danilak | G11C 16/349 |
| | | | | 365/185.09 |
| 2009/0132778 | A1* | 5/2009 | Danilak | G11C 16/349 |
| | | | | 711/E12.001 |
| 2010/0180179 | A1 | 7/2010 | Lastras-Montano | |
| | | | | G06F 11/1012 |
| | | | | 714/759 |
| 2016/0006462 | A1* | 1/2016 | Hanham | H03M 13/3715 |
| | | | | 714/764 |
| 2016/0034206 | A1* | 2/2016 | Ryan | G06F 3/064 |
| | | | | 711/103 |
| 2016/0124848 | A1* | 5/2016 | Bellorado | G06F 12/0246 |
| | | | | 711/103 |
| 2017/0125118 | A1* | 5/2017 | Lee | G11C 16/3459 |
| 2017/0139823 | A1* | 5/2017 | Tomlin | G06F 3/0643 |
| 2018/0165022 | A1* | 6/2018 | Tomic | G06F 11/1004 |

* cited by examiner

EFFICIENT REDUNDANCY MANAGEMENT IN KEY-VALUE NAND FLASH STORAGE

CROSS REFERENCE

This application claims priority from US provisional patent Ser. No. 62/609,342 filing date Dec. 22, 2017 which is incorporated herein by reference.

BACKGROUND

NAND flash is the storage media for many products. That includes memory cards such as SD card and CF card, embedded storage such as eMMC and UFS and the high-end solid-state drives (SSDs). While being several orders of magnitude faster (especially for random access) than spinning hard drives (HDDs), its management is more complex. The reason is that there is a different unit sizes for read, write (program) and erase, which makes in-place programming impossible. In the following we will refer to SSDs, but the same concepts apply for all NAND flash based memory products.

SSD is composed of NAND flash units, a controller, and optionally DRAM units. The NAND flash units are arranged in channels, where each channel is composed of several ways (NAND dies). All dies in a channel share the same bus to the controller. Each die is constituted from a plurality of blocks, where each block is composed of multiple word-lines (WLs). Each WL is composed of plurality of cells, and each cell contains several bits of information. Devices that have a single bit per cell are called SLC (single level cell), while devices that contains 2, 3 and 4 bits per cells are referred to as MLC, TLC and QLC, respectively. Each level of bits in a WL is called a page. Typically, one page can store about 18 KB, and each block have typically 64-256 WLs. While it is possible to read any page (or part of it) from a NAND die, programming is possible only for erased blocks, and it is done in a predefined order. Thus, updating a page in-place is impossible. One must first copy all valid information from the block to an already erased block, possibly together with the updated page value, and then the block can be erased. After erase operation is completed, the block is ready for programming. The described process is referred to as "garbage collection", and is generally responsible for most of the actual programming to the device. An important figure of merit for SSDs is the ratio between number of actual ("physical") bytes written to the device to the number of logical bytes sent by the host (user). This number is referred to as write-amplification (WA), and it obviously affect overall write performance In order to mitigate WA, the SSD is over-provisioned with extra blocks. It can be shown, that with higher over-provisioning (OP), the WA is lower. For example, for 100% OP, the WA can be 1—that is, there are no excessive writes per logical write. Typical numbers for OP ranges between 7% to 40%, where high-end devices which are designed to meet the strict requirements of data-centers and enterprises storage systems come with higher OP, and low-end, consumer-grade SSDs are with low OP.

The NAND flash media itself suffers from several sources of interferences and noises. Hence, the raw data read from a page typically contains bit errors. To overcome this problem, error correction codes (ECC) are generally applied, which enables correction of multiple bit errors. Example of ECC codes that are used by the industry are BCH and LDPC codes. To enable error correction, part of the page must be used for code overhead. Typical numbers are 7%-13% of the data. Hence, a page of 18 KB with ECC overhead of 12.5% contains only 16 KB of information, while the other 2 KB are for ECC overhead (or parity) bits. The error rate of a page, which is referred to as raw BER is a monotonic increasing function of both the PE cycle count of the page and the time that has been passed from the moment of programming that page. As the quality of cells deteriorates with the PE cycles count, it is important to provide a strong enough ECC to enable appropriate number of PE cycles with high reliability. The longevity of a flash NAND device is commonly referred to as endurance, and the amount of time that a certain page can hold its information untacked is referred to as retention.

There is a probability for a block to have significant worse performance than the average. Such block may experience programming or erase error (that is, a program or erase operation was not completed successfully), too high error rates, etc. Conventionally, such blocks are marked as "bad" blocks and are not used by the controller. Each NAND die contains 2%-4% extra blocks for that purpose. Whenever a block is declared "bad" other block from the extra blocks pool is assigned instead of the bad block.

SUMMARY

There may be provided a method for error correction of logical pages of an erase block of a solid state drive (SSD) memory, the method may include determining an erase block score of the erase block, wherein the calculating is based on a program erase (PE) cycle of the erase block and one or more erase block error correction parameter; determining, based on (a) the erase block score, and (b) a mapping between the erase block score and one or more page error correction parameters for each page type out of multiple pages types, the one or more page error correction parameter for each page type; and allocating, within each page of the erase block, an overprovisioning space and an error correction space, based on at least one page error correction parameter related to a page type of the page.

The method may include applying an error correction function on a content of a page related to the erase block, wherein the applying is based on the one or more page error correction parameters of a page type of the page.

Each erase block error correction parameter of the one or more erase block error correction parameter, may be an average of the page error correction parameter of different types of pages of the erase block.

Pages of different types may differ from each by one out of (a) bit significance, and (b) physical location within the erase block.

Pages of different types may differ from each by (a) bit significance, and (b) physical location within the erase block.

The one or more page error correction parameters may include a programming speed, and/or any space allocation.

The method may include increasing the overprovisioning space while a contribution of the overprovisioning space to a programming speed of the page exceeds a loss due to increasing of the overprovisioning space.

The method may include estimating the PE cycle of the erase block based on a programming speed at an end-of-life PE cycle.

The method may include estimating the one or more erase block error correction parameter of the erase block based on a programming speed at an end-of-life PE cycle.

The method may include estimating a first function that maps between the programming speed at an end-of-life PE cycle and the one or more erase block error correction parameter of the erase block.

The method may include determining the one or more page error correction parameter for each page type based on an endurance and a throughput parameter.

There may be provided a non-transitory computer readable medium that stores instructions for: determining an erase block score of an erase block, wherein the calculating is based on a program erase (PE) cycle of the erase block and one or more erase block error correction parameter; wherein the erase block is a part of a solid state drive (SSD) memory; determining, based on (a) the erase block score, and (b) a mapping between the erase block score and one or more page error correction parameters for each page type out of multiple pages types, the one or more page error correction parameter for each page type; and allocating, within each page of the erase block, an overprovisioning space and an error correction space, based on at least one page error correction parameter related to a page type of the page.

There may be provided a solid state drive (SSD) memory controller that comprises at least one circuit that is configured to determine an erase block score of an erase block, wherein the calculating is based on a program erase (PE) cycle of the erase block and one or more erase block error correction parameter; wherein the erase block is a part of a solid state drive (SSD) memory; determine, based on (a) the erase block score, and (b) a mapping between the erase block score and one or more page error correction parameters for each page type out of multiple pages types, the one or more page error correction parameter for each page type; and allocate, within each page of the erase block, an overprovisioning space and an error correction space, based on at least one page error correction parameter related to a page type of the page.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE DRAWINGS

Notations

Figure 1:
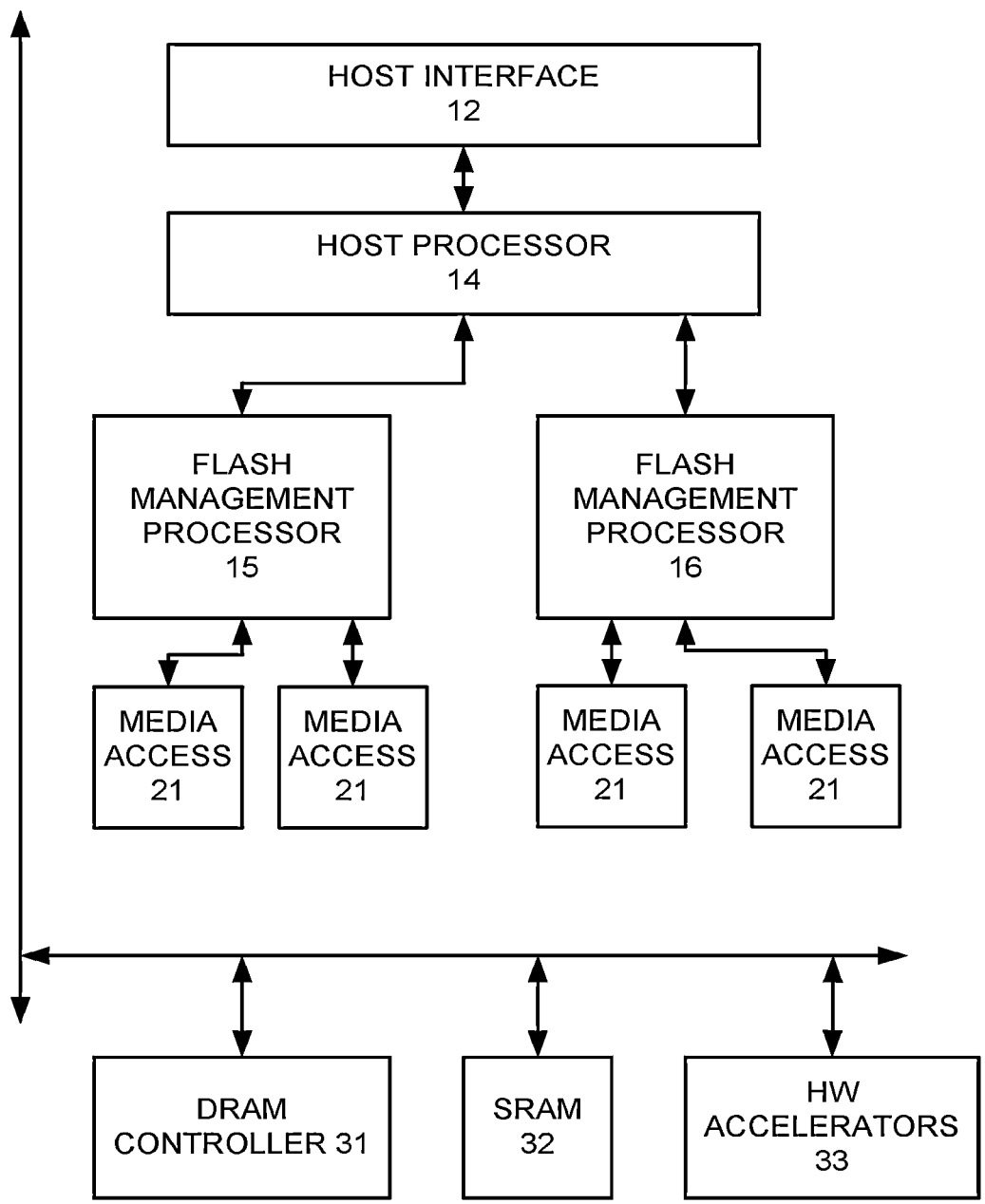
FIG. 1 is an example of a SSD memory controller.

A physical PE cycle count is a number of program erase cycle an erase block has undergone. Assuming that all erase block underwent the same number of PE cycles then the a physical PE cycle count may equal the ratio between the number of bytes that are programmed to the device and the device size in bytes.

The relationship between the physical PE cycle and a logical PE cycle is WA. Thus, the logical PE cycle to be the ratio between the number of bytes written by the host from the start to the current logical PE to the device size in bytes.

The overall OH overhead in the SSD is denoted by T, while the OH allocated for ECC at the $n^{th}$ logical PE cycle is denoted by $\alpha_n$. Thus—a user or manufacture may allocate a certain percent of the entire SSD to various data and/or metadata that are not user data.

The OP at the $n^{th}$ logical PE cycle is then $\rho_n = T - \alpha_n$.

The WA at the $n^{th}$ logical PE cycle is a function of $\rho_n$, and is denoted by $A(\rho_n)$. Thus For the following analysis, we need a function which express the required ECC OH for a given raw BER to achieve required frame/bit error rate after decoding. The raw BER is the bit error rate associate with the storage—before applying any ECC.

Let us denote this function by $\Gamma(p)$, where p is the raw BER.

A possible approximation for $\Gamma(p)$ is $$\frac{h(p(1+\delta))}{1 - h(p(1+\delta))},$$

where h( ) is the binary entropy function and δ express the gap between of the theoretical capacity of the SSD memory (for example capacity under the Shannon constraint) and the actual capacity of the SSD memory—the BSC channel capacity. Another reasonable expression may be the sphere packing bound, or approximations thereof.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a memory controller capable of executing the method and should be applied mutatis mutandis to a non-transitory computer readable medium that stores instructions that once executed by a computer result in the execution of the method.

Any reference in the specification to a memory controller should be applied mutatis mutandis to a method that can be executed by the memory controller and should be applied mutatis mutandis to a non-transitory computer readable medium that stores instructions that once executed by a computer result in the execution of the method.

In conventional block devices, data is read and programmed in units called sectors. Typical sector sizes ranges between 512 B to 4 KB (in powers of 2). Modern operation systems generally use 4 KB sectors. For maximal performance, each sector should be read in a single page read, otherwise, latency and overall throughput is deteriorated. Hence, the page size (along with the sector size) determine the ECC overhead. For example, a page of 18 KB must use 16 KB for data (4 sectors) and 2 KB for overhead (12.5%). Overhead is denoted OH. The next possible number 12 KB for data and 6 KB for ECC overhead (50% OH). Clearly, such coarse OH resolution dictates a single ECC OH for all blocks in a single device. Moreover, when designing the page OH, the manufacturer must take into account that the same type of NAND die may be integrated into different product, which have different requirements of programming speed, endurance, etc. Hence, tailored page OH for each product is generally impossible.

Another source of losses in current NAND products is the variable nature of the media reliability. After each programming/erase (PE) cycle the quality of the cell is deteriorated due to high stresses on the channel oxide. Hence, the higher the PE cycle count is, the lower the reliability, and stronger ECC is needed (with higher OH). The constraints presented above don't allow fine-tuning of the ECC OH during the NAND life, so the worst case PE cycle count is considered when designing the page OH.

There is provided a method, a memory controller and a computer program product in the field of storage devices whose interface is key-value. With this interface, the user presents a key and accompanied value to store, and to retrieve the value it presents the associated key. Both key and value are variable-length.

The method, memory controller and computer program product use a variable-length ECC, whose OH is optimized according to the NAND temporally status. We can change the ECC OH as we desire, as there is no prior determination of a "sector" size, and we can change the information part of the page, thus changing the OH as required. The effect of increasing the ECC OH is that the OP is reduced, and vice-versa. Hence, with a single parameter we can tune the optimal mix of ECC OH and OP. In the following we provide analysis and method for optimization.

The method, memory controller and computer program product described hereinafter may be implemented in memory controller. FIG. 1 illustrates the memory controller 10.

It composed of a host processor 14 which is connected to the user domain (via interface 14), flash management processors 15 and 16 which responsible to the logical operation and maintenance of the flash devices and plurality of media access units (20, 21, 22, 23) which handle the physical operations on the flash devices, as well as ECC and optionally encryption/decryption and compression/decompression.

There also may be several hardware (HW) acceleration units 33 which offload certain operations from the processors. The proposed methods may be implemented in any of the components described above. Also present in a controller are DRAM controller 31 and host interface (PCIe, ethernet, etc') HW. The SSD memory controller may also be coupled to DRAM memory 32.

According to one example, we aim at maximizing the endurance of the SSD.

As key-value SSD does not have to follow strict requirements on the information size in a page, it is possible to optimize that value as a function of the logical/physical PE cycle count of the block. Thus, at beginning of life, the memory controller assigns only a small value for $\alpha$ is (as the quality of NAND cells is high).

This results in increasing the value for $\rho$, which in turn reduces WA.

In one embodiment, after each logical PC cycle, the memory controller updates the value of $\alpha$ to accommodate the current raw BER of the cells. In order to have an estimation of the raw BER, the number of errors that were corrected using the ECC from that block. As noted above, we denote the required ECC OH at the $n^{th}$ logical PE cycle count by $\alpha_n$. At each logical PE cycle, there are A ($\rho_n$) physical PE cycles. Let us denote the raw BER as a function of the physical PE cycle count by f( ). Then, the raw BER at the beginning of the $n^{th}$ logical PE cycle count is $$p_n = f\left(\sum_{l=1}^{n-1} A(\rho_l)\right)$$

$$\rho_l = T - \Gamma(p_n).$$

We also use the well-known approximation for WA, $$A(\rho) = \frac{1+\rho}{2\rho}.$$

The above generates a recursive equation which express the required partitioning between ECC OH and OP OH.

In order to solve the equation, we need to have information on f( ), which is NAND dependent. It is possible to approximate f( ) with polynomial interpolation of the measured function, for example.

The function is measured by the controller using ECC data (number of corrected errors) and PE cycle and retention statistics that are collected continuously by the memory controller. From our NAND measurements, we found that linear approximation gives excellent results. Hence, we assume that there exists parameters a and h such that f(x)=ax+b. The memory controller thus may resort to simple linear approximation of its measurements. Combining all the above we have the following recursive equation on $\alpha_n$ $$\alpha_n = \Gamma\left(a\sum_{l=1}^{n-1} \frac{1+T-\alpha_l}{2(T-\alpha_l)} + b\right). \quad \text{Equation 1}$$

Figure 4:
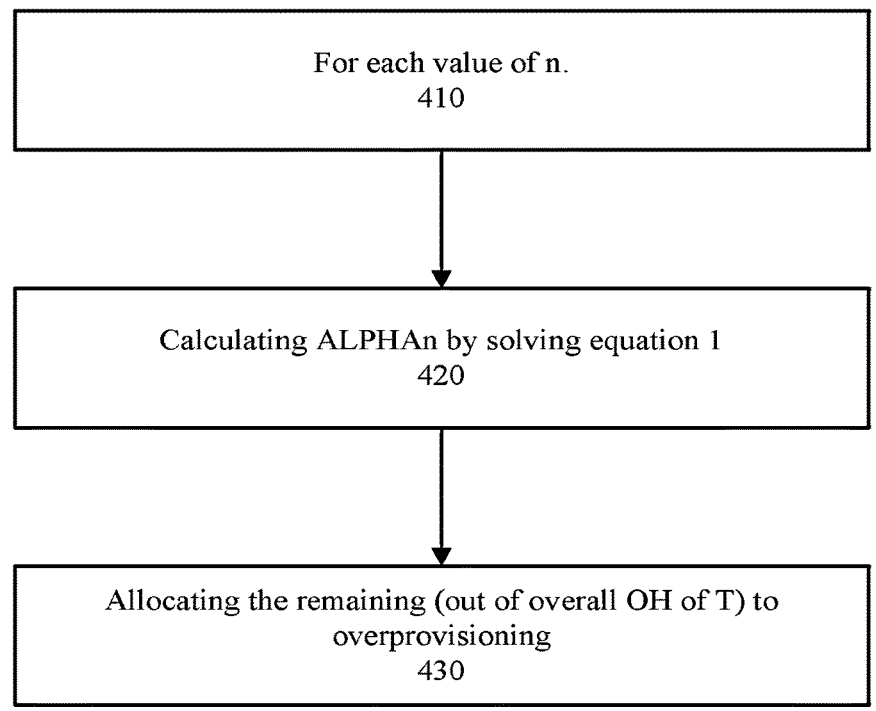
FIG. 4 is an example of a method.

FIG. 4 illustrates method 400 for allocating SSD memory resources, the method may include:

for each value of n (410):
  Step 420 of Determining selected values of ALPHAn (at the n'th PE cycle) by solving equation 1

$$\alpha_n = \Gamma\left(a\sum_{l=1}^{n-1} \frac{1+T-\alpha_l}{2(T-\alpha_l)} + b\right)$$

Step 430 of allocating the remaining (out of overall OH of T) to overprovisioning $-\rho_n=T-\alpha_n$. This calculating of $\alpha_n$ is designed to increase endurance.

This method may be executed by the memory controller and may (or may not assume) that all pages of a block use the same allocation of $\alpha_n$ and $\rho_n$.

In below, we present the resulted endurance gain of our method, compared with conventional art. In the example, we take the following parameters $$T=0.2$$

$$a=1e-6$$

$$b=1e-5$$

Figure 2:
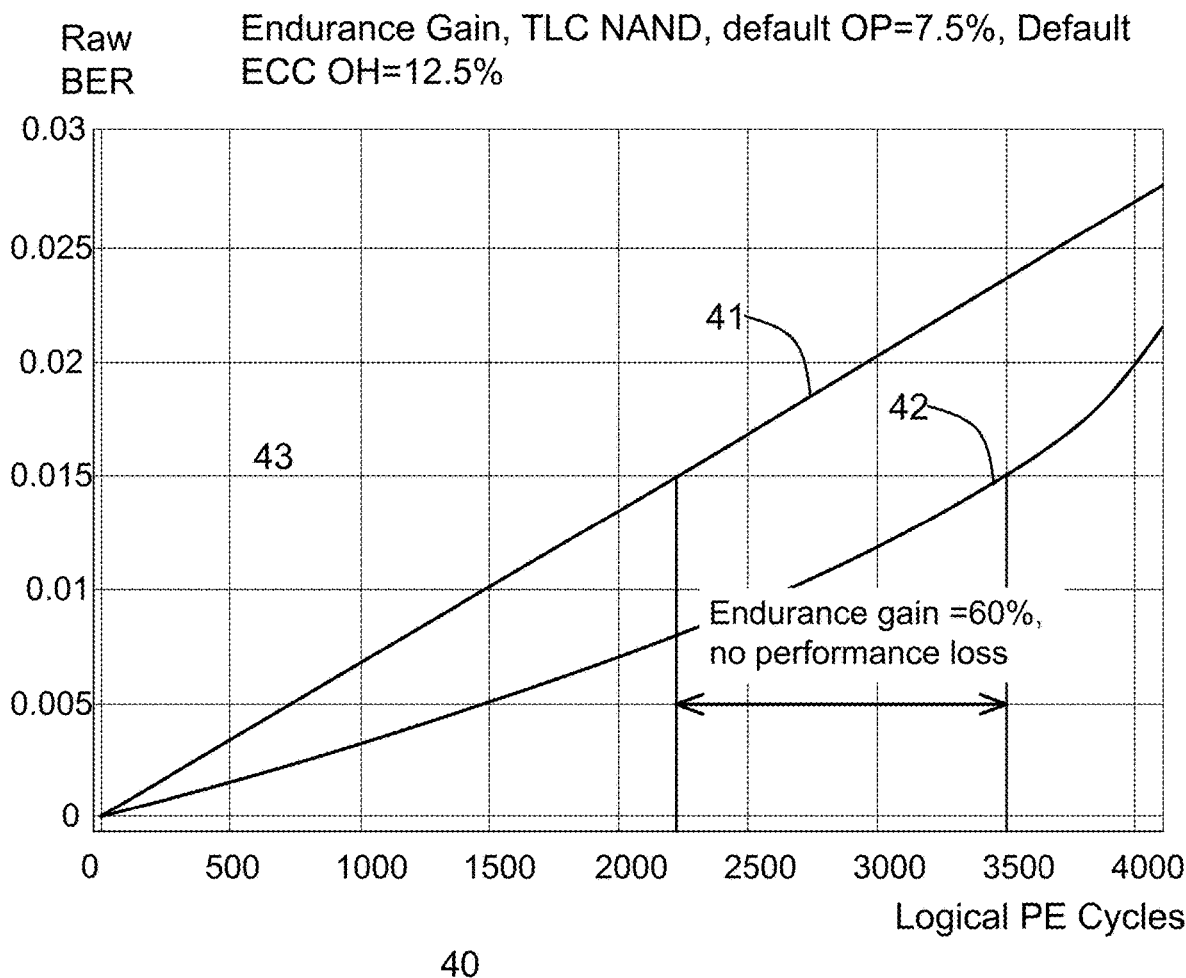
FIG. 2 illustrates a relationship between various parameters.

We assume a TLC NAND, which implies conventional ECC OH of 12.5, and default OP of 7.5%, which is typical for consumer grade SSD. Conventional scheme achieves 2200 logical PE cycles (or drive writes), while the proposed method requires 12.5% ECC OH just after 3500 PE cycles. The meaning is that we get 60% endurance improvement with no performance penalty, as the OP at 3500 PE cycle is the same as for the original scheme. A clear advantage of our scheme is that we can extend endurance further at the expense of write performance loss (increased WA), but without deteriorating data integrity. See graph 40 of FIG. 2—comparing raw BER versus logical PE for the suggested method (curve 42) versus prior art relationships (curve 41) and limits (curve 43).

In another embodiment, we take advantage of the fact that even in the same block, not all the pages behave similarly, in terms of raw BER, and allocating only one ECC rate for all pages in the block may results in sub-optimality.

For example, it is known that the different pages inside a WL behave differently, where the raw BER is a function of number of thresholds that are needed to determine the page bits values. Also, WL at the edges of the block are more error-prone. The conventional method to deal with the disparity in quality between MSB, CSB and LSB is to equalize the levels so that the raw BER of each page are equal.

It can be shown that such method is suboptimal, and results in a raw BER which is worse than the average raw BER before equalization. Moreover, allocating appropriate rate for each page may be better than both averaging the pages (which is referred to as bit-interleaved coded-modulation) or equalizing the pages.

In key-value SSD, the possibility to use different code parameters for different pages provides a solution to this problem, and we can choose the optimal rate for each page type. Also, in conventional scheme, for WLs at the edges of the block a reduced number of levels are used to improve the reliability (e.g., only 4 levels in TLC NAND which normally uses 8 levels, or 2 levels in MLC NAND). We can improve capacity by just allocating more OH to that particular WL, so instead of losing ⅓ or ½ of the capacity of those WLs, we lose much less (typically 5%). According to this embodiment, the memory controller optimizes the ECC OH of each type of page inside a block.

There is the question how the memory controller indicates the ECC code parameters. Clearly, it is desirable to have the parameter stored in the SSD's DRAM or SRAM, so that no NAND access is required. Hence, storing the ECC parameters per page or codeword is prohibitive. On the other hand, it is well known, that even in the same block, not all the pages behave similarly, in terms of raw BER, and allocating only one ECC rate for all pages in the block may results in sub-optimality.

Our solution to the problem relies on the fact that the quality of the pages inside a block are location dependent. Hence, the memory controller provides a score for each block, based on its PE cycle and average error count (just before the erasure) which will indicate a block profile. That is using a single parameter per block, the memory controller can still set the proper ECC parameter per each page, based on off-line NAND measurements. An example of a score may be $C=[rPE_{cycles}+tRawBER]$, for appropriately determined parameters r and t. For example, r may be 1 and t may be 10000. Then, C can point to a lookup table which contains a block profile. Block profile is a list of all the ECC parameters of all the pages in the block.

So, the memory controller just stores tables which indicates what ECC parameters should be used for each page type in a block with score x. Hence, the memory controller may store at a memory (for example—a fast memory such as a DRAM, a SRAM) (only) one parameter per block plus a list of tables which serves all blocks. The size of a table is the parameter size times the number of different types of pages in a block (e.g., MSB, CSB, LSB, first, second, last, one before last, middle, and the appropriate cross-sections of the above, which results in 15 types).

Figure 5:
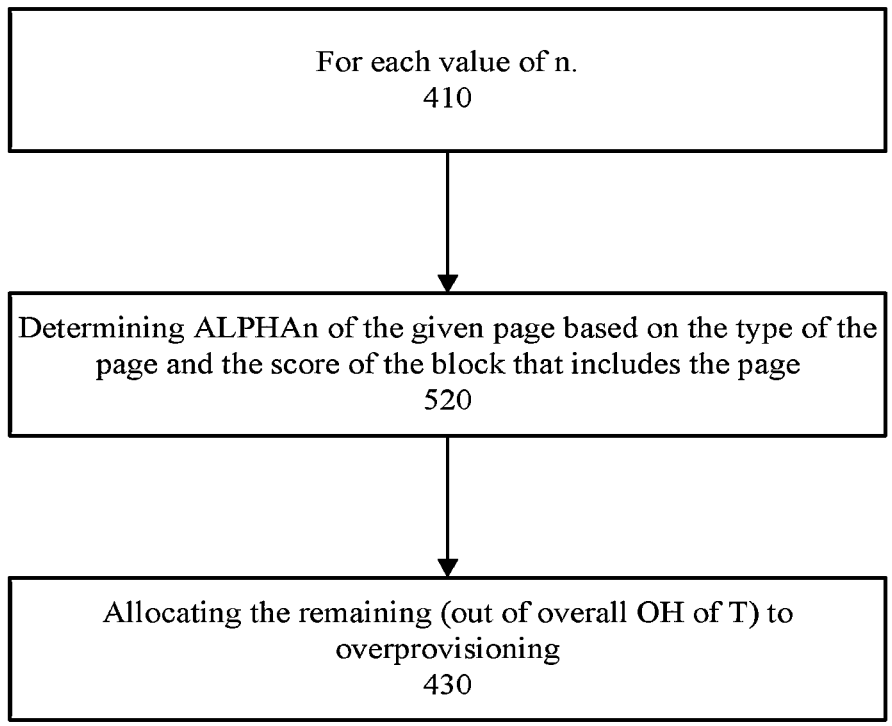
FIG. 5 is an example of a method.

FIG. 5 illustrates method 500 for allocating SSD memory resources, the method may include—

Step 410 of evaluating for each value of n.

Step 520 of—at the n'th PE cycle—and for each page type (i) determining the $\alpha_n$ of the given page based on the type of the page and the score of the block that includes the page.

Step 530 of allocating the remaining OH resources of the page to overprovisioning. The calculating of $\alpha_n$ is designed to increase endurance—but takes into account the type of the page and the score of the block.

In yet another example the memory controller optimizes the programming speed jointly with the OH allocation between OP and ECC.

Figure 3:
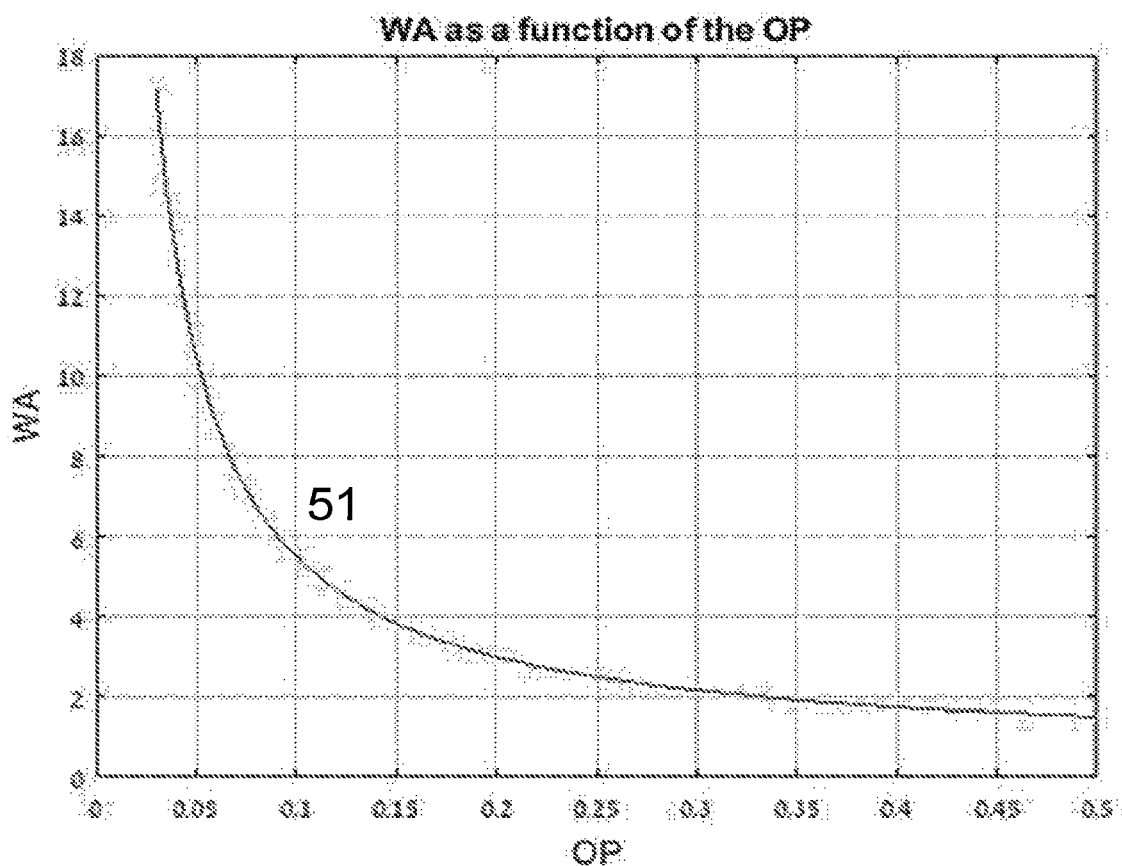
FIG. 3 illustrates a relationship between various parameters.

In FIG. 3 we depict the WA as a function of the OP (curve 51 of graph 50). It is evident that for large values of OP, there is a diminishing return of WA improvement. Enterprise-grade SSDs that must meet strict performance requirements, have to sacrifice this OP. In key-value SSD we suggest increasing the ECC OH at the expense of OP, and use a faster programming algorithm. The downside of faster programming is higher raw BER which is treated by the stronger ECC. Hence, overall—we obtain net performance improvement.

In order to find the optimal solution, the memory controller may measure the raw BER as a function of programming speed at end-of life PE cycle. Let us denote this function by $S(t_{prog})$. To find this value, which is NAND dependent, it is possible to approximate $S(t_{prog})$ with 2D polynomial interpolation of the measured function, for example. The measurement is done for several programming times and several PE cycles count, to get a grid of RawBER values.

Then, the required programming speed when we use ECC OH of ALPHA: $\alpha$ ($\alpha$ being a variable not necessarily related to $\alpha_n$) is $$t_{req}(\alpha)=S^{-1}(\Gamma^{-1}(\alpha)) \qquad \text{Equation 2}$$

Any increase in $\alpha$ results in improved error correction capability on one hand, but also increased WA due to lower OP on the other hand. Hence, the memory controller is programmed to increase $\alpha$ as long as its contribution to programming speed exceeds the loss due to increased WA.

The optimal value for a is then the solution to the following equation $$\frac{\partial t_{req}(\alpha)}{\partial \alpha} = -\frac{\partial A(T-\alpha)}{\partial \alpha} \quad \text{Equation 3}$$

Or equivalently, as both S and Γ are 1:1 we can solve directly, with no need to derivate the inverse function, and get $$\frac{1}{\frac{\partial S}{\partial x}\Big|_{x=S^{-1}(\Gamma^{-1}(\alpha))} \cdot \frac{\partial \Gamma}{\partial x}\Big|_{x=\Gamma^{-1}(\alpha)}} = -\frac{\partial A(T-\alpha)}{\partial \alpha} \quad \text{Equation 4}$$

In this example, the memory controller is configured to minimize programming time with the same coverage of physical PE cycle. It may be desired, however, to keep the same coverage of logical PE cycle instead, as it better reflects the needs of the user (who cares about number of disc writes).

To achieve that the memory controller needs to take into account the WA in the function S above. Thus, S should be a function of two variables, $t_{prog}$ and n, the physical PE cycle count. That is, $S=S(t_{prog}, n)$. Given α (which, as noted, is obtained by solving equations 3 or 4), it is easy to find the required physical PE cycle to support certain logical PE cycle (just multiple it by A(T−α)).

Then, we need to update Equation 2 accordingly to $$t_{req}(y) = S^{-1}(\Gamma^{-1}(\alpha), n) \quad \text{Equation 5}$$

Where $\alpha = S^{-1}(x, n)$ is the unique value for which $x = S(\alpha, n)$.

Figure 6:
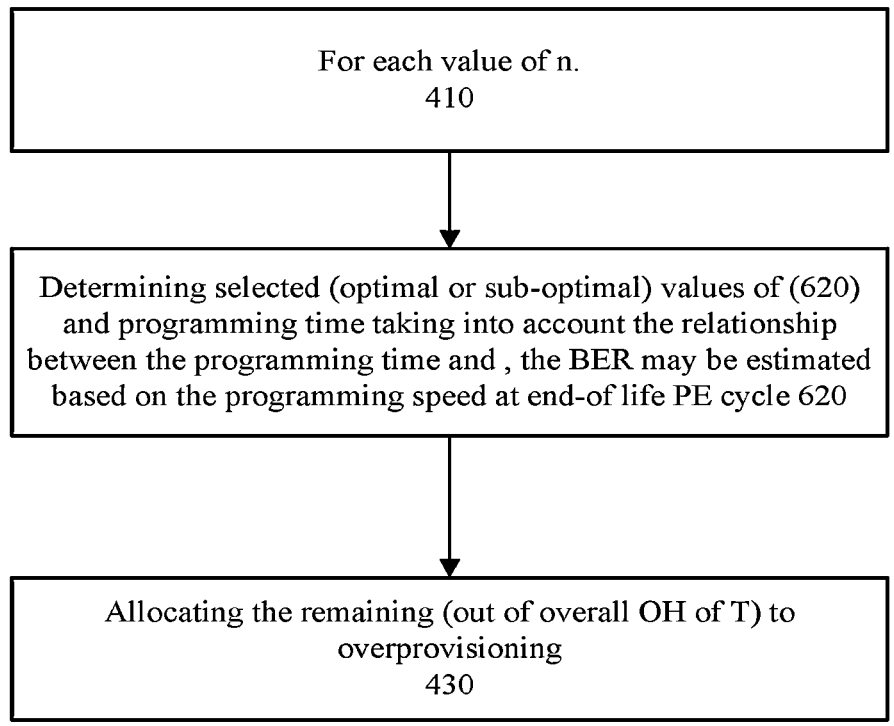
FIG. 6 is an example of a method.

FIG. 6 illustrates method 600 for allocating SSD memory resources, the method may include—for each value of n—at the n'th PE cycle—(i) determining selected (optimal or sub-optimal) values of $\alpha_n$ and programming time taking into account the relationship between the programming time and $\alpha_n$, the BER may be estimated based on the programming speed at end-of life PE cycle, (ii) allocating the remaining OH resources of the page to overprovisioning. The calculating of $\alpha_n$ is designed to increase endurance—but takes into account the type of the page and the score of the block.

Figure 7:
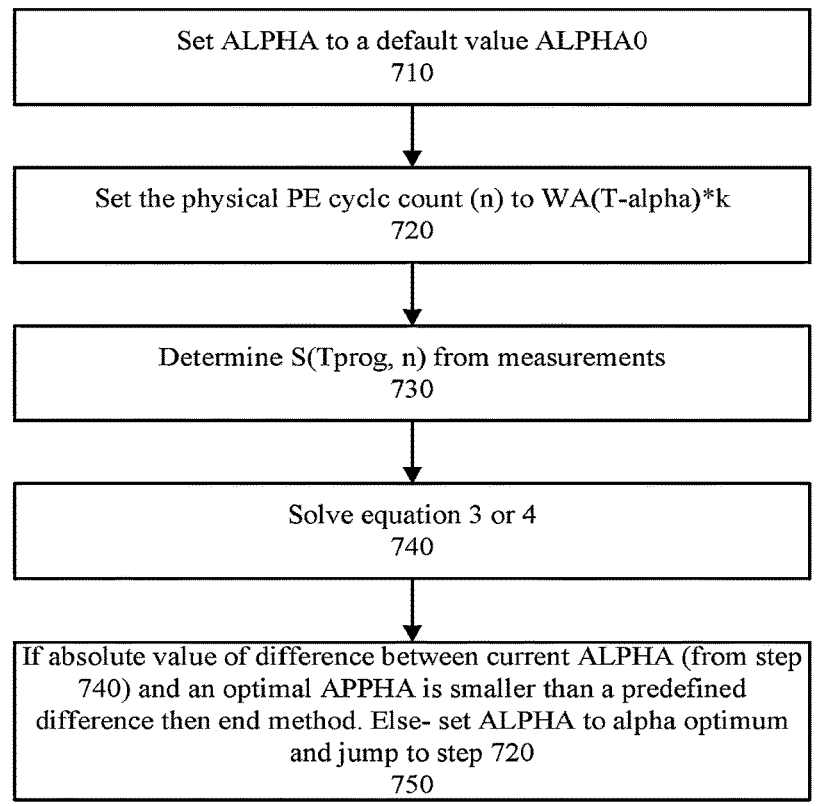
FIG. 7 is an example of a method.
Figure 8:
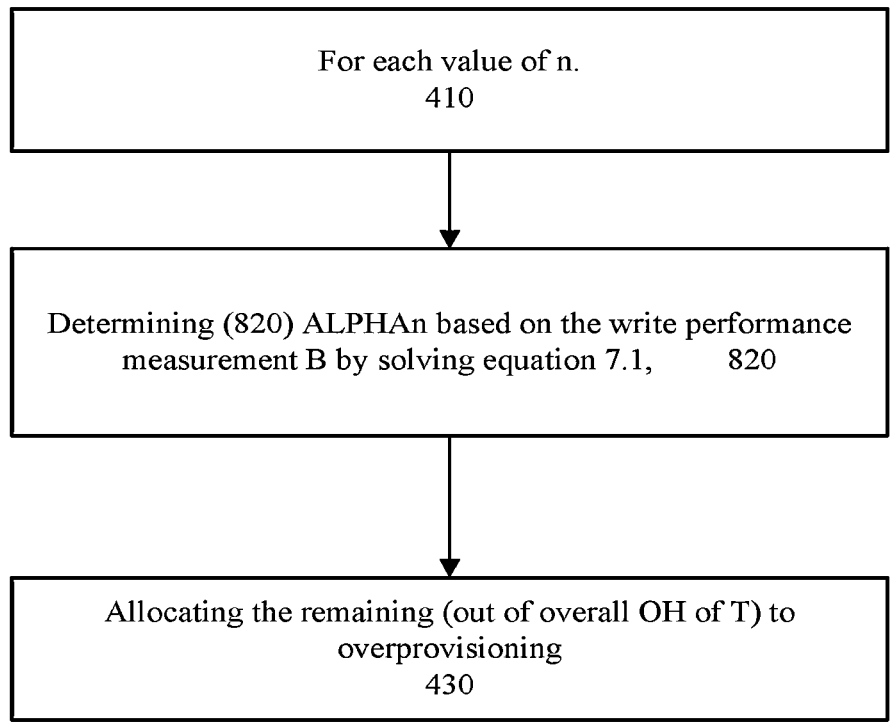
FIG. 8 is an example of a method.
Figure 9:
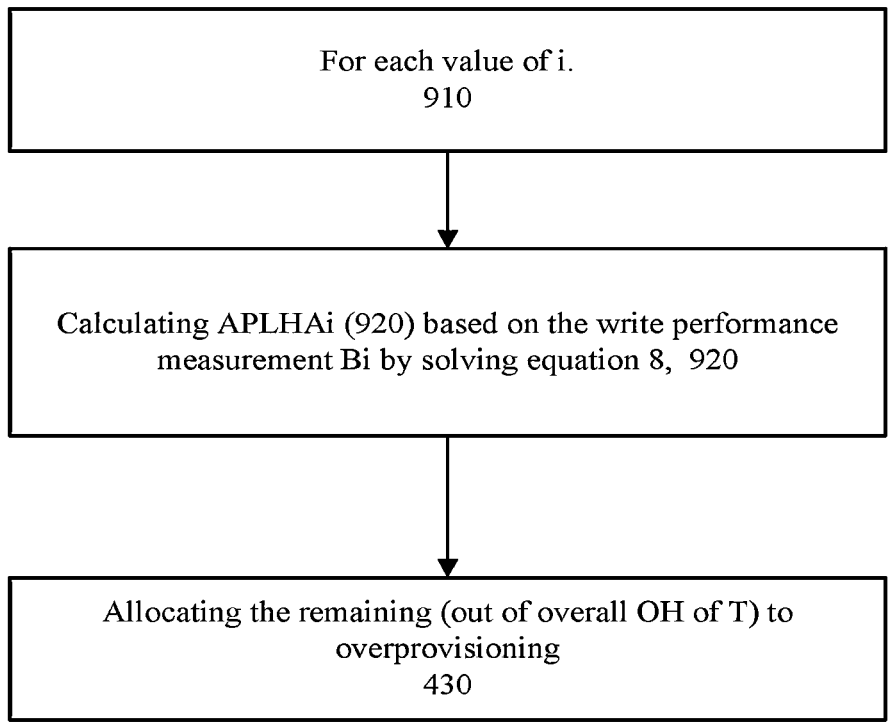
FIG. 9 is an example of a method.
Figure 10:
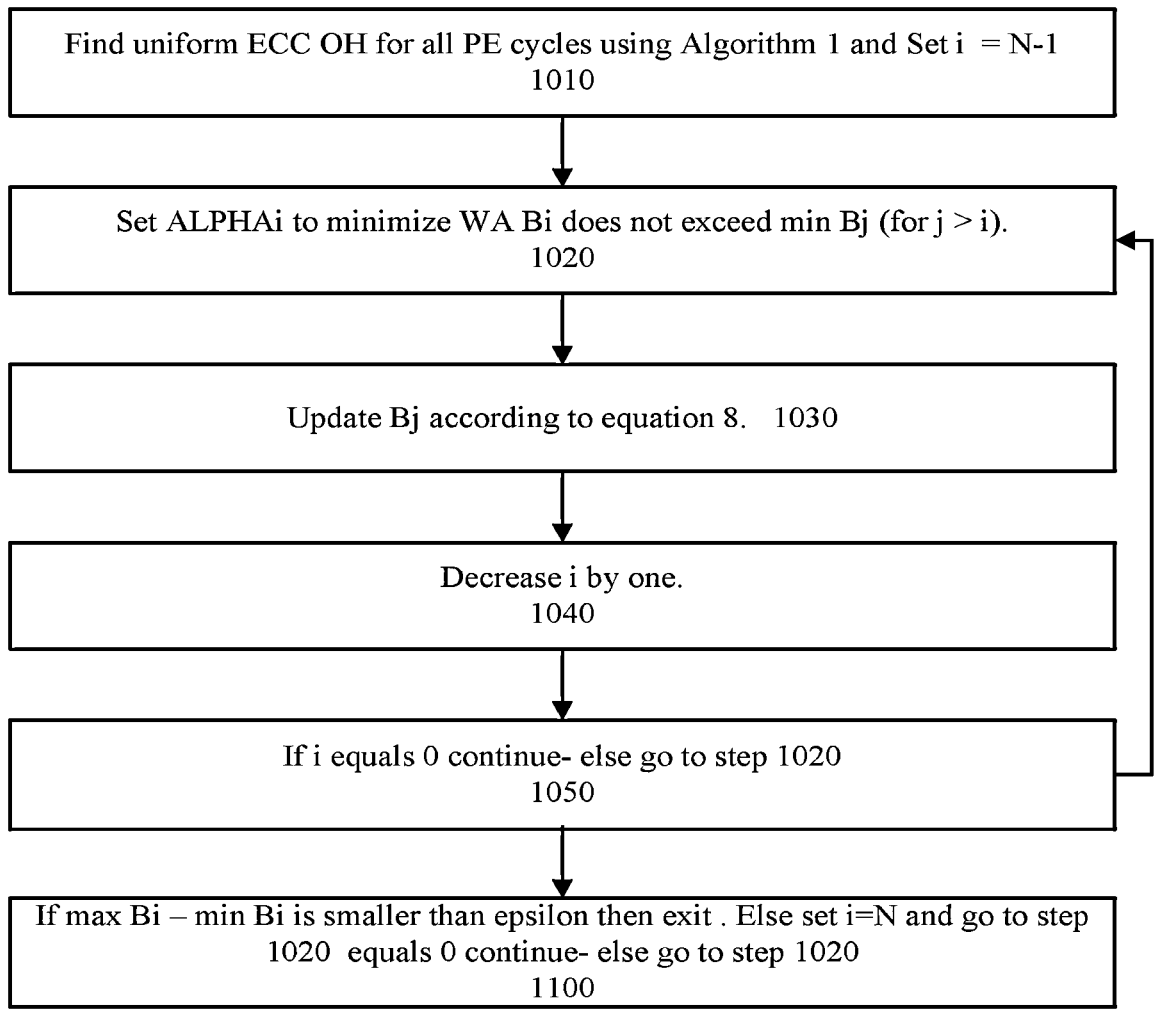
FIG. 10 is an example of a method.

In practice, it may be difficult to estimate such function, as it requires a lot of measurement and programming optimization. Instead, we suggest to follow the following method to be implemented by the memory controller:

---
Algorithm 1 (FIG. 7-method 700)

Input: Required number of drive writes k
Total OH T
Default ECC OH $\alpha_0$
Tolerance parameter ε (may be determined in any manner)
1. Set a = $\alpha_0$, the default ECC OH (step 710)
2. Set n=WA(T-α)*k (step 720)
3. From measurements (measuring programming speed at end of PE cycle) - determine $S(t_{prog}, n)$ (step 730)
4. Solve Equation 3 (or equivalently, Equation 5) to find $\alpha_{opt}$ (step 740)
5. If |α − $\alpha_{opt}$| < ε exit. Else, continue. (step 750)
6. Set α = $\alpha_{opt}$
7. Go to step 2
---

In practice, Algorithm 1 converges in 2-3 iterations, hence only few S functions are needed for evaluation.

Accordingly, there may be provided a method 700 for allocating SSD memory resources that may include—for each value of n—at the n'th PE cycle—(i) determining the $\alpha_n$ of the given page based steps 1-7 above, (ii) allocating the remaining OH resources of the page to overprovisioning.

In yet another example the memory controller is configured to combine the first example which adapt the ECC OH according to current block status with the last example which improves write performance. The purpose of this embodiment is to maximize endurance under certain write performance requirement.

In the first embodiment, the memory controller is configured to maximize endurance without deteriorating write performance, and in the last embodiment it configures to maximize write performance without deteriorating endurance.

If the memory controller is configured to combine the capabilities of both embodiments, we can tune the performance of the SSD according to the user requirements. The user can determine either the required programming speed or the required number of drive writes (logical PE cycles). Then, the following method will optimize the other parameter at end-of-life given the requirement.

Endurance Maximization under Write Performance Requirement

Given write performance requirement B, the method minimizes at every logical PE cycle the required ECC OH, so the WA is also minimized. The write performance is proportional to the write rate of a single WL, and adaptation to multi-ways multi-channel SSD is straight-forward, as one just have to multiply the single way calculation below by the number of ways, and limit the result by the throughput of a single channel. Then, for multi-channel the above result should be multiplied by the number of channels, capped by any processing limitation that exists in the controller. Assume that the WL size is C, then the write throughput of a single WL depends on the required time to transmit the WL over the NAND bus ($t_{bus}$) plus the programming time $t_{prog}$. The throughput is proportional to $$BW_{NAND} \propto \frac{C}{t_{bus} + t_{prog}}$$

As the memory controller takes into account the write performance from the host perspective, it must take into account the WA, hence, $$BW_{host} \propto \frac{C}{A(T-\alpha)(t_{bus} + t_{prog})}$$

where as usual, α denotes the current ECC OH. According to the proposed embodiment, the memory controller is configured to maximize endurance, hence it set x to the minimal required value to provide reliable storage. If the flash device is configured to program at speed $t_{prog}$, then at physical PE cycle n we have $\alpha = \Gamma(S(t_{prog}, n))$. Ignoring constant proportion term, we finally have for the first PE cycle the following equation to be numerically solved by the memory controller $$B = \frac{C}{A(T - \Gamma(S(t_{prog}, 1)))(t_{bus} + t_{prog})} \quad \text{Equation 6}$$

where the only unknown variable is $t_{prog}$.

Thus, solving Equation 6, the memory controller determines the required ECC OH for the first physical PC cycle. For simplicity, we assume that the NAND parameters do not change significantly during a single write drive (that is, A(T−x) physical writes), so the memory controller can fix the ECC OH for the entire logical write. So, we have $\alpha_1 = \Gamma(S(t^*_{prog}, 1))$, where $t^*_{prog}$ is the solution to Equation 6. In a similar way, to find the optimal ECC OH for the 2$^{nd}$ logical PE cycle, the memory controller need to solve the following equation $$B = \frac{C}{A(T - \Gamma(S(t_{prog}, \lceil A(T - \alpha_1) \rceil)))(t_{bus} + t_{prog})} \quad \text{Equation 7}$$

Solving it will give us $\alpha_2$. For the nth logical PE cycle, we will have the following equation 7.1

$$B = \frac{C}{A\left(T - \Gamma\left(S\left(t_{prog}, \left\lceil \sum_{l=1}^{n-1} A(T - \alpha_l) \right\rceil\right)\right)\right)(t_{bus} + t_{prog})} \quad \text{Equation 7.1}$$

Accordingly, there may be provided a method 800 for allocating SSD memory resources that may include—for each value of n (410)—at the n'th PE cycle—(i) determining (step 820) the $\alpha_n$ based on the write performance measurement B by solving equation 7.1, (ii) allocating (step 430) the remaining OH resources of the page to overprovisioning.

The above method results in the optimal endurance given a throughput requirement, as in each step it minimizes the WA.

Write Performance Maximization under Endurance Requirement

This case is more complicated, as a greedy approach that maximizes write performance at each stage may results in excessive WA which ultimately may cause our SSD not to meet the endurance requirements. Let us denote the endurance requirement by N.

Suppose that the memory controller assigned ECC overheads to any PE cycle (denoted by $\alpha_i$, i=1, ..., N). Then, the programming time at the i$^{th}$ PE cycle is $t_i = S^{-1}(\Gamma^{-1}(\alpha_i)$, $\sum_{i=1}^{i-1} A(T-\alpha_i))$. To achieve our goal, the memory controller need to solve the following minmax problem $$\min_{\{\alpha_i\}} \left[ \max_i \left( \frac{C}{A\left(T - \Gamma\left(S\left(t_{prog}, \left\lceil \sum_{l=1}^{n-1} A(T - \alpha_l) \right\rceil\right)\right)\right)(t_{bus} + t_i)} \right) \right]$$

Lt us denote the inner term by $B_i$, that is $$B_i = \frac{C}{A\left(T - \Gamma\left(S\left(t_{prog}, \left\lceil \sum_{l=1}^{n-1} A(T - \alpha_l) \right\rceil\right)\right)\right)(t_{bus} + t_i)} \quad \text{Equation 8}$$

Accordingly, there may be provided a method for allocating SSD memory resources that may include—for each value of i (910)—at the i'th PE cycle—(i) calculating APLHAi (920) based on the write performance measurement $B_i$ by solving equation 8, (ii) allocating (930) the remaining OH resources of the page to overprovisioning.

The solution to this problem is to choose $\alpha_i$ such that all $B_i$ are equal.

Method 1000 is an example for solving this problem. The method may start from the last PE cycle with a reasonable value, and then optimize all $B_i$, i<N. Then calculate $B_N$ again and repeat the process until no improvement is reached

---

Algorithm 2

Input: Required number of PE cycles N
       Total OH T
       Default ECC OH $\alpha_0$
       Tolerance parameter ε
1. Find uniform ECC OH for all PE cycles using Algorithm 1 and Set i = N-1, (step 1010)
2. set $\alpha_i$ to minimize WA such that $B_i \leq \min_{j>i} B_j$. As we only reduce WA at each stage i, we don't deteriorate $B_j$, j > i. (step 1020)
3. Update $B_j$, j > i according to Equation 8 (step 1030)
4. Set i = i − 1 (step 1040)
5. If i = 0 continue, else go to step 1020 (step 1050)
6. If $\max_i B_i - \min_i B_i < \varepsilon$ exit. Else set $i = N$ go to step 1020 (step 1060)

---

There may be provided a memory controller that may implement any of the mentioned above memory management processes. The memory controller may be configured (for example programmed) to implement one memory management process or another. The memory controller may sense any parameter related to the memory management process and/or may be fed by one or more parameters.

There may be provided a method executed by a memory controller for implementing one or more of the mentioned above memory management processes.

There may be provided a computer program product that stores instructions that once executed by the memory controller cause the memory controller to implement one or more of the mentioned above memory management processes.

This application provides a significant technical improvement over the prior art—especially an improvement in computer science.

Any reference to the term "comprising" or "having" should be interpreted also as referring to "consisting" of "essentially consisting of". For example—a method that comprises certain steps can include additional steps, can be limited to the certain steps or may include additional steps that do not materially affect the basic and novel characteristics of the method—respectively. The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may cause the storage system to allocate disk drives to disk drive groups. A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. The computer program may be stored internally on a computer program product such as non-transitory computer readable medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc. A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system. The computer system may for instance include at least one processing unit, associated memory and a number of input/output (I/O) devices. When executing the computer program, the computer system processes information according to the computer program and produces resultant output information via I/O devices. In the foregoing specification, the invention has been described with reference to specific examples of embodiments of the invention. It will, however, be evident that various modifications and changes may be made therein without departing from the broader spirit and scope of the invention as set forth in the appended claims. Moreover, the terms "front," "back,"
"top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality. Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality. Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments. Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner. Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'. However, other modifications, variations and alternatives are also possible. The specifications and drawings are, accordingly, to be regarded in an illustrative rather than in a restrictive sense. In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage. While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method for error correction of logical pages of an erase block of a solid state drive (SSD) memory, the method comprises:
    determining an erase block score of the erase block, wherein the determining is based on a program erase (PE) cycle of the erase block and an erase block raw bit error rate (BER); wherein the erase block comprises pages, each page of the erase block is of a page type out of multiple page types; wherein the multiple page types comprises page types that differ from each by at least one out of (a) a bit significance, and (b) a physical location within the erase block:
    retrieving a block profile, using the erase block score as a pointer, wherein the block profile lists one or more ECC parameters for each page type of the multiple page types; wherein the one or more ECC parameters comprise an overprovisioning for each one of the multiple page types; and
    allocating, within each page of the erase block, an overprovisioning space and an error correction space, based on at least one of the one or more ECC parameters related to a page type of the page, the page type belongs to the multiple page types.

2. The method according to claim 1, wherein the erase block score is a linear function of the PE cycle of the erase block and the erase block BER.

3. The method according to claim 1, comprising storing block profiles of multiple erase blocks in a random access memory unit.

4. The method according to claim 1, wherein a physical location of a page within the erase block is selected out of a first page of the erase block, a second page of the erase block, a last page of the erase block, a one before last page of the erase block, and a middle page of the erase block.

5. The method according to claim 1, wherein the multiple page types comprise different combinations of (a) the bit significance, and the physical location within the erase block.

6. The method according to claim 5, wherein a physical location of a page within the erase block is selected out of a first page of the erase block, a second page of the erase block, a last page of the erase block, a one before last page of the erase block, and a middle page of the erase block.

7. A non-transitory computer readable medium for error correction of logical pages of an erase block of a solid state drive (SSD) memory, the non-transitory computer readable medium stores instructions for:
    determining an erase block score of the erase block, wherein the determining is based on a program erase (PE) cycle of the erase block and an erase block raw bit error rate (BER); the erase block comprises pages, each page of the erase block is of a page type out of multiple page types; wherein the multiple page types comprises page types that differ from each by at least one out of (a) a bit significance, and (b) a physical location within the erase block;
    retrieving a block profile, using the erase block score as a pointer to a block profile that lists one or more ECC parameters for each page type of the multiple page types; wherein the one or more ECC parameters comprise an overprovisioning for each one of the multiple page types; and
    allocating, within each page of the erase block, an overprovisioning space and an error correction space, based on at least one of the one or more ECC parameters related to a page type of the page, the page type belongs to the multiple page types.

8. The non-transitory computer readable medium according to claim 7, wherein the erase block score is a linear function of the PE cycle of the erase block and the erase block BER.

9. The non-transitory computer readable medium according to claim 7, that stores instructions for storing block profiles of multiple erase blocks in a random access memory unit.

10. The non-transitory computer readable medium according to claim 7, wherein a physical location of a page within the erase block is selected out of a first page of the erase block, a second page of the erase block, a last page of the erase block, a one before last page of the erase block, and a middle page of the erase block.

11. The non-transitory computer readable medium according to claim 7, wherein the multiple page types comprise different combinations of (a) the bit significance, and the physical location within the erase block.

12. The non-transitory computer readable medium according to claim 11, wherein a physical location of a page within the erase block is selected out of a first page of the erase block, a second page of the erase block, a last page of the erase block, a one before last page of the erase block, and a middle page of the erase block.

13. A solid state drive (SSD) memory controller that comprises at least one circuit that is configured to:
    determine an erase block score of an erase block, wherein the determining is based on a program erase (PE) cycle of the erase block and an erase block raw bit error rate (BER); the erase block comprises pages, each page of the erase block is of a page type out of multiple page types; wherein the multiple page types comprises page types that differ from each by at least one out of (a) a bit significance, and (b) a physical location within the erase block;
    retrieve a block profile, using the erase block score as a pointer to a block profile that lists one or more ECC parameters for each page type of the multiple page types; wherein the one or more ECC parameters comprise an overprovisioning for each one of the multiple page types; and
    allocate, within each page of the erase block, an overprovisioning space and an error correction space, based on at least one of the one or more ECC parameters related to a page type of the page, the page type belongs to the multiple page types.

14. The SSD memory controller according to claim 13, wherein the erase block score is a linear function of the PE cycle of the erase block and the erase block BER.

15. The SSD memory controller according to claim 13, wherein the at least one circuit is configured to access block profiles of multiple erase blocks that are stored in a random access memory unit.

16. The SSD memory controller according to claim 13, wherein a physical location of a page within the erase block is selected out of a first page of the erase block, a second page of the erase block, a last page of the erase block, a one before last page of the erase block, and a middle page of the erase block.

17. The SSD memory controller according to claim 13, wherein the multiple page types comprise different combinations of (a) the bit significance, and the physical location within the erase block.

18. The SSD memory controller according to claim 13, wherein a physical location of a page within the erase block is selected out of a first page of the erase block, a second page of the erase block, a last page of the erase block, a one before last page of the erase block, and a middle page of the erase block.

* * * * *